United States Patent [19]

Tanida et al.

[11] 4,172,390

[45] Oct. 30, 1979

[54] LEVER FOR MEMORY FINE TUNING ARRANGEMENTS FOR TURRET TYPE TELEVISION TUNER

[75] Inventors: Takeyoshi Tanida; Michiaki Narihiro, both of Osaka, Japan

[73] Assignee: New Nippon Electric Company, Ltd., Osaka, Japan

[21] Appl. No.: 737,479

[22] Filed: Nov. 1, 1976

[30] Foreign Application Priority Data

Apr. 30, 1976 [JP]  Japan .......................... 51-55244[U]
Jun. 28, 1976 [JP]  Japan .......................... 51-85346[U]
Jun. 29, 1976 [JP]  Japan .......................... 51-86336[U]

[51] Int. Cl.² ............................................ F16H 35/18
[52] U.S. Cl. ................................... 74/10.8; 74/10.41; 74/10.9; 74/10.54; 74/10.6
[58] Field of Search ................ 74/10.41, 10.8, 10.9, 74/10.6, 10.54; 334/51, 86; 248/222.4, 223.1, 223.2, 224.2, 73

[56] References Cited

U.S. PATENT DOCUMENTS

| | | | |
|---|---|---|---|
| 2,554,675 | 5/1951 | Magnetti | 248/223.1 |
| 3,183,726 | 5/1965 | Badger | 74/10.8 |
| 3,244,012 | 4/1966 | Ma | 74/10.8 |
| 3,248,674 | 4/1966 | Fulton | 74/10.8 |
| 3,316,770 | 5/1967 | Badger | 74/10.8 |
| 3,415,128 | 12/1968 | Smart | 74/10.8 |
| 3,415,130 | 12/1968 | Fichter | 74/10.8 |
| 3,466,549 | 9/1969 | Milnes | 74/10.8 |
| 3,473,392 | 10/1969 | Atkinson | 74/10.8 |
| 3,474,362 | 10/1969 | Harten | 74/10.8 |
| 3,548,672 | 3/1969 | Conrad | 74/10.8 |
| 3,973,229 | 8/1976 | Weigel | 74/10.41 |

Primary Examiner—Charles J. Myhre
Assistant Examiner—R. C. Turner
Attorney, Agent, or Firm—W. G. Fasse; W. W. Roberts

[57] ABSTRACT

In a pivotally mounted member of the memory fine tuning arrangement for a turret type television tuner, a pivotally moved lever plate provided integrally with a pivotal shaft having head portion, neck portion and body portion, is pivotally mounted on a front wall chassis base by setting the neck portion of the pivotal shaft into a notch of the front wall, wherein assembly of the lever plate to the front wall chassis base can be achieved by the two steps of inserting the head and neck portions of the pivotal shaft into a large opening portion of the notch in the front wall and slidingly setting the neck portion in a small opening portion from the large opening portion through continuous opening portion of the notch. To ensure easy and accurate assembly, a vertical support for the pivotal shaft on the front wall is affixed to the pivotally mounted member so that the parallel relation between the front wall and the lever plate is maintained.

12 Claims, 9 Drawing Figures

LEVER FOR MEMORY FINE TUNING ARRANGEMENTS FOR TURRET TYPE TELEVISION TUNER

BACKGROUND OF THE INVENTION

The present invention relates to a memory fine tuning arrangement used for television tuners, and more particularly to television tuner of the type which provides a so-called pre-setting fine tuning arrangement for automatically providing a fine tuning adjustment for each individual television channel by employing the pivotally mounted member. Specifically, the present invention is directed to an improved pivotal shaft of the pivotally mounted member commonly used for both rotary and push pre-setting fine tuning devices and which is manufactured economically by plastic molding technique.

Generally, mechanical channel selecting devices for VHF television tuners are mainly classified as rotary-switching types or turret types. Turret type tuners include an incrementally rotatable channel selector shaft for selectively connecting certain ones of a plurality of tuned circuit elements for each of a plurality of channel selector positions. For clear reception in each of the channel positions of the selector shaft, it is customary to include an impedance device having an adjustable value in the local oscillator circuit. This impedance device is conventionally adjusted by means of a fine tuning shaft concentrically mounted with respect to the channel selector shaft. The fine tuning shaft is connectable by the viewer to adjust the tuning impedance for each predetermined position of the selector shaft. Various memory fine tuning arrangements have been proposed to maintain individual channel tuning adjustments once they have been established by the user without requiring adjustment of the fine tuning shaft of the tuner by the user each time a particular channel is selected. One such arrangement is the push pre-setting type fine tuning device which requires the operator to push in a control knob of the fine tuning shaft and while maintaining pressure on the knob to rotate the same to adjust a fine tuning element within the tuner, the other is the rotary pre-setting type fine tuning device which requires the operator to only rotate a control knob of the fine tuning shaft for fine tuning adjustment. These devices are particularly useful on turret type tuners having individual tuned coil assemblies or units for each channel. These coil units are removably mounted in the rotatable turret structure, and are provided individually with an oscillator coil, the inductance of which may be adjusted by means of an adjustable element which extends into an opening in the end of the coil units adjacent the oscillator coil.

Since television tuners are made in large volumes, in order to be commercially competitive, it is desirable to provide a low cost pre-setting fine tuning device with a minimum number of parts and that can be assembled in an easy and simple manner. The fine tuning device requires a mechanical arrangement for translation of rotary motion of the fine tuning shaft into rotary motion of the adjustment element, since the fine tuning shaft is offset laterally from the axis of the adjustment element in the individual coil units. Also, engagement with the adjustment element must terminate automatically when the user releases the fine tuning shaft so that the turret is free to rotate to another channel position. For example, such fine tuning devices are disclosed in U.S. Pat. No. 3,316,770 for push pre-setting type memory fine tuners and in U.S. Pat. No. 3,183,726 for rotary pre-setting type memory fine tuners. These fine tuning devices include a pivotally mounted member on the front wall of the chassis base with a coil spring between the member and the front wall to exert a bias force on the member in the predetermined direction. The pivotally mounted member is provided with a lever plate having one end pivotally mounted to the front wall of the chassis base by using a pivot pin mounted on the front wall. In this assembly, however, it is requested to mount the pivot pin at a right angle on the front wall, and to design such parts with close tolerance for maintaining a parallel relation between the lever plate and the front wall. Therefore, the lever plate generally must be made by die-casting metallic zinc, and the production cost has been materially elevated by the necessity of using expensive materials and processes.

OBJECTS OF THE INVENTION

Accordingly, it is an object of the present invention to provide a new and improved memory fine tuning for television tuners wherein an improved easily constructed pivotally mounted member is provided for ensuring the fine tuning of the tuner in each channel selecting position.

Another object of the present invention is to provide a new and improved mounting construction for mounting the lever plate on the front wall chassis base in such a simple manner that it can be manufactured most economically by mass production methods.

A further object of the present invention is to design a pivotally mounted member employed common to different types of pre-setting fine tuning devices for turret television tuners.

A still further object of the present invention is to provide a pivotally mounted member made of plastic materials in such a manner that its construction is most stable, light-weight and reliable in production handling.

SUMMARY OF THE INVENTION

In accordance with the present invention, a memory fine tuning mechanism is provided which utilizes a pivotally mounted member on the front wall of the chassis base. The pivotally mounted member, which is normally biased by spring means in the direction of the fine tuning shaft, comprises a pivotally moveable lever plate, a pivotal shaft and an idler shaft, these elements being made by die-molding integrally of materials such as synthetic resin. The idler shaft which supports gear means for transmitting fine tuning movement is located at one end of the lever plate, while the pivotal shaft is located at the other end of the lever plate. The pivotal shaft head, neck, and body portions are pivotally mounted in a notch of the front wall by setting the neck portion in a small opening portion of the front wall notch. Since the notch is formed with a large diameter opening portion, a small diameter opening portion and a continuous opening portion, the pivotally mounted member is assembled by steps of inserting the head and neck portions into the large opening portion and sliding the pivotal shaft to the small opening portion from the large opening portion passing through the continuous opening portion, with cooperation of the bias force of a coil spring, so as to rotatably secure the neck portion on the front wall. Therefore, the memory fine tuning device for turret type tuners using the pivotally mounted member of the present invention may be provided with simple construction and by mass production methods.

Advantageously, the present invention provides pivotally mounted members adaptable to both push and rotary pre-setting type devices, as common parts. Since the modification of the member can be easily made by die-molding of synthetic resin materials, structural improvements such as reinforcing frame means, accurate positioning means, tapered clutch coupling means for the idler shaft or friction controlling means of grooves or ribs, are easily added to the pivotally mounted member so as to provide stable and reliable structure suitable for each pre-setting type of fine tuning device.

Briefly, in the memory fine tuning device attached to the chassis base of the turret type television tuner of the present invention, the pivotally mounted member is provided with a pivotal shaft having a neck of small diameter portion connecting body and head portions, wherein the neck portion of the pivotal shaft is rotatably attached to the chassis base by means of a notch having a large opening portion and a small opening portion connected to each other. In addition, the pivotally mounted member is provided with a projecting portion which extends in the bias direction thereof. This end portion abuts on the surface of the chassis base whereby the pivotally mounted and moveable member is installed with accurate relation on the chassis base without inclining the pivotal shaft due to biasing tension applied thereto, so as to permit reasonable tolerances for the assembly parts. In other words, a memory fine tuning mechanism is provided which utilizes a number of individually adjustable tuning elements which are rotatable with the selector shaft. The fine tuning shaft of the tuner is concentric with the selector shaft and is releasably engageable with a selected one of these adjustable tuning elements by means of a gear train including a pair of gears, one of which gear is connected to clutch means, such as of applying a frictional load to the second gear on the pivotally moved member so that when clutch means is operated effectively to change the position of the spring biased pivotally moveable member on the chassis base, the pair of gears establish engagement with one of the adjustable fine tuning elements of the tuner upon rotation of the first gear on the tuning shaft in the same direction, thereby the tuning element may be adjusted in one direction. When the fine tuning shaft, to which the first gear is connected, is released, the pivotally moved member returns to its initial position and engagement of the second gear with the tuning element ceases. Therefore, the pivotally moveable member which is normally biased by spring means in the direction toward the fine tuning shaft has a first position (initial position) for disengagement and a second position for engagement of the tuning adjustable element and the second gear.

The pivotally moveable member can be made of synthetic resin, such as fireproof nylon material, by injection molding, and the pivotal shaft and idler shaft are also integrally formed with the necessary improved portions without any supplemental process, for lowering of the production costs of the pivotally moveable member.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS:

Referring now to the drawings, therein is illustrated a memory fine tuning arrangement used for the television tuner according to one embodiment of the present invention. In FIGS. 1 to 8, VHF tuner 11 of the turret type comprises a turret 12, a chassis base 13, a memory fine tuning arrangement 16 and a shield cover (not shown). The chasis base 13 which is only partially illustrated, has a front wall 14, a top wall 15, and a rear wall (not shown) and forms a reinforced U-shape case structure with bent portions on the both sides. The rotatable turret 12 and a stator bar 17 with multiple contacts are encased within the chassis base 13 by the shield cover. For selection of the VHF television channels, a plurality of coil units 18 are removably mounted in the rotatable turret 12. Each of coil units 18 includes a local oscillator coil 19 as well as RF and mixer coils (not shown), which are selectively engaged with contacts of the stator bar 17 when the turret 12 is rotated by a manually operable channel selector shaft 20 to different channel selecting positions.

The selector shaft 20, which carries a detent mechanism at the rear wall side, the fine tuning mechanism at the front wall side and the turret at the center, is journalled in both the front and rear walls of the chassis base. The front bearing is contructed of a rear location washer 21 mounted on the selector shaft 20 and a front bearing strap 22 fixed on the front wall 14. The front bearing strap 22 is provided with a pair of location projections 23 and a suitably shaped opening so that the bearing of the selector shaft 20 is achieved by these parts together with a torsion wire spring 26 of which the end portion engages a bottom flange 25 of a slotted retaining washer 24, as more clearly seen in FIG. 9 in the assembled bearing structure. The other end portion of the wire spring 26 acts as a detent spring of the detent mechanism on the rear wall side (not shown).

The oscillator coil 19 on each coil unit 18 of the turret 12 is fine tuned by means of an adjustable element 27 which extends into the end of the coil unit 18 to a point within the oscillator coil 19. In order to adjust the elements 27, each element is provided with a pinion gear 28 at the end and a threaded portion which is retained with the resilient holder on the coil unit stick. It will be understood that the adjustable elements 27 are moved through a predetermined path as the turret 12 is rotated and the pinion gear 28 of any element may be selectively engaged with drive gear means of the fine tuning arrangement 16 by fine tuning operation.

Also, in order to limit the moveable range of the adjustable element 27, a stop member 31 of synthetic material is mounted on the front wall 14 by means of the clearance opening 29 formed therein. The stop member 31 is provided with a hook portion 32 for readily snapping it into place on the front wall 14, and a curved surface portion extended inside the front wall 14 to limit forward movement of the adjustable element 27. In addition, a bottom surface 33 and a boss 34 are formed on the stop member 31 as limit means of the radially outward movement and the axially inside movement of driving gear means. Also, the inside curved surface of the stop member 31 acts as cam means to move any one of the adjustable elements 27 into its associated stick as the turret 12 is rotated, in the event any stick is initially placed in the turret with the element 27 projecting out of the stick beyond the normal limit of travel thereof. The limit of the rearward movement of the adjustable element 27 may be achieved by abutting the pinion gear 28 to the stick of the coil unit 18.

Figure 1:
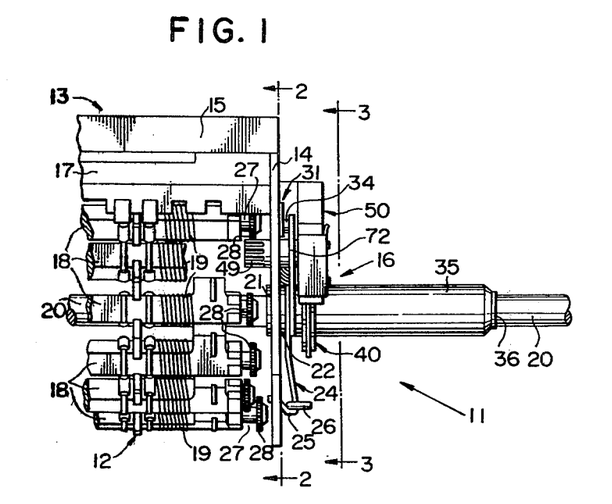
FIG. 1 is a partial side elevational view of a television tuner embodying a pivotally mounted member for the memory fine tuning arrangement of the rotary pre-setting type, in accordance with the present invention.
Figure 8:
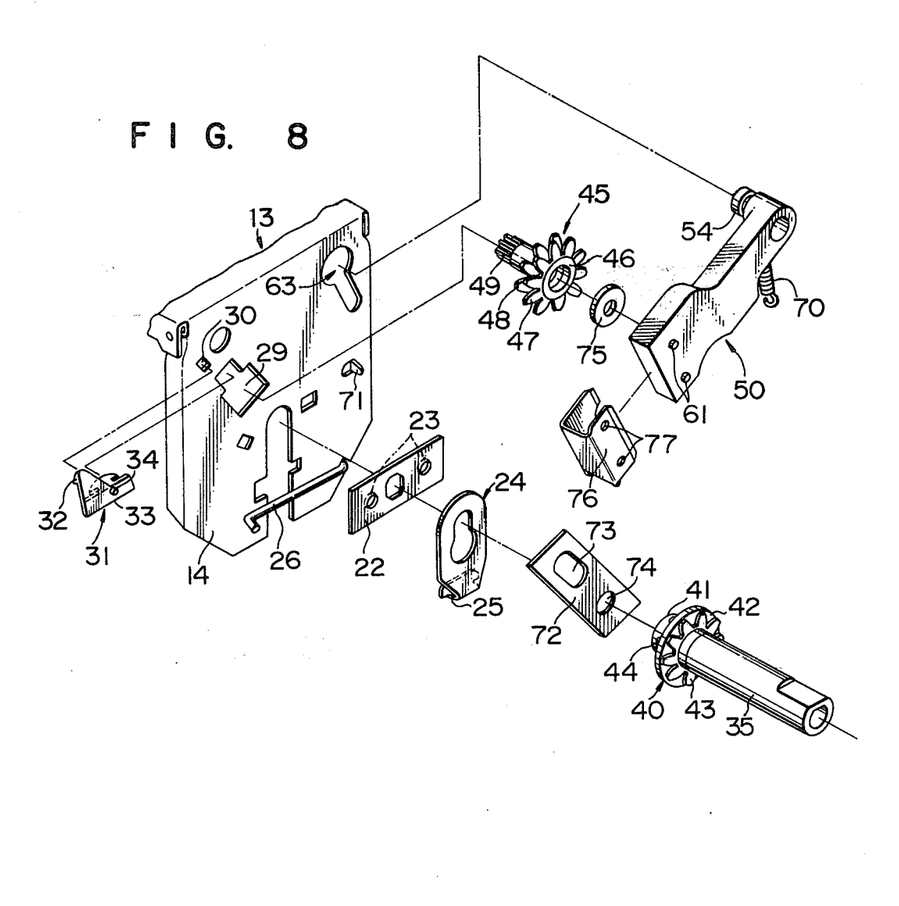
FIG. 8 is an exploded view illustrating certain details of a protion of the fine tuning arrangement of FIG. 1.

In order to individually adjust the adjustable elements 27, there is provided a pivotally mounted member 50 of the present invention which cooperates with the gear transmission mechanism of the fine tuning arrangement 16. As shown in FIG. 1, this arrangement 16 includes a fine tuning shaft 35 concentrically positioned for free rotation on the channel selector shaft 20. C-shaped washer 36 maintains the fine tuning shaft 35 assembled on the channel selector shaft 20. On the rear end of the fine tuning shaft 20, the hub 41 of a first driving gear 40 is integrally formed. In the case of the rotary pre-setting type, as shown in FIG. 8, the first driving gear 40 includes a radially extending flange 42 and a pair of substantially identical spur gears 43 and 44 are formed integrally on the opposite sides of the flange 42. The flange 42 extends radially outwardly beyond the tips of teeth of the spur gears 43 and 44, and the teeth of these gears are offset relative to one another in predetermined phase relationship.

The first driving gear 40 is in driving engagement with a second set of spur gears 47 and 48 integrally formed with the hub portion 46 of a second driving gear 45 which is pivotally mounted to rotate about the axis of an idler shaft 53 on the pivotally mounted member 50 as described hereinafter. The pair of substantially identical spur gears 47 and 48 are spaced apart to define a groove therebetween and are formed integrally on one end of the hub portion 46 and extend radially outwardly beyond the periphery of the hub portion. The teeth of the spur gears 47 and 48 are offset relative to each other. Moreover, the flange 42 of the first driving gear 40 is positioned within the groove between the spur gears 47 and 48 so as to maintain the desired axial position of the first and second driving gears 40 and 45 while permitting separation of the gear centers. The hub portion 46 of the second driving gear 45 includes a pinion 49 formed integrally on the other end thereof and normally out of engagement with, but engageable with the pinion gear 28 on the adjustable elements 27. Preferably, the gears are each molded from suitable plastic material to provide a low cost gear train which will operate smoothly and effectively.

For selectively pivoting the pinion 49 into and out of driving engagement with different ones of the pinion gears 28 one each selected channel position, the pivotally mounted member 50 of the present invention is mounted on the front wall 14 of the chassis base 13. It is preferred to provide this member by injection molding process of synthetic materials, such as Nylon-6 resin of the Nylon T-422 supplied by Toyobo Co., which is accepted by U. L. as satisfying the standard Test for Flammability of plastic material (UL 94 Flame Class V-2), as commonly used for the push pre-setting fine tuning arrangement.

Figure 6:
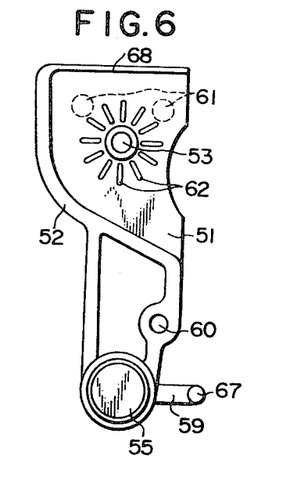
FIG. 6 is a plan view of the rear side of the pivotally moveable member employed in the fine tuning arrangement of FIG. 1, in accordance with the present invention.
Figure 7:
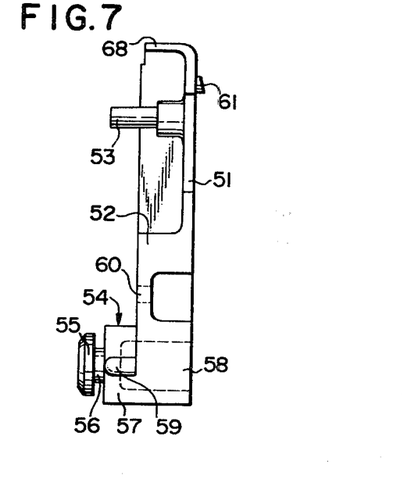
FIG. 7 is a side view of the pivotally moveable member of FIG. 6.

As shown in FIGS. 6 and 7, the pivotally mounted member 50 includes a pivotal shaft 54 and a lever plate 51 with reinforced framing 52 which are formed integrally together with the idler shaft 53 for rotatably mounting the second driving gear 45. The use of the framing 52 serves to make effective utility of mounting spaces and to give a necessary reinforcement with uniform thickness suitable for plastic molding process, such as of thermosetting resin by the use of injection molding technique. Plastic die-molded pivotally mounted member 50 has the advantage of lowering the production cost, although a zinc die-casting member, which has advantages in strength and size allowance may be also employed for the pivotally mounted member 50 of the present invention. The pivotal shaft 54 includes a head portion 55, a reentrant neck portion 56 and a body portion 57. The body portion 57 is provided with a cavity 58 which serves to simplify plastic molding as well as saving the quantity of necessary materials. In addition, it is desired to make projecting portion 59 integral with the pivotal shaft 54 so that the pivotally mounted member 50 may be maintained on the front wall 14 of the chassis base 13 with a desired relation for fine tuning movement thereof. For exerting bias force to the member 50, a hole 60 for fastening a tension coil spring 70 is preferably provided at the rear side of the framing 52.

In the case of the rotary pre-setting type, the lever plate 11 is provided with a pair of bosses 61 for retaining a spring clip 76 of clutch means and a plurality of small slots 62 radially extended around the base portion of the idler shaft 53 for preventing undesired slipping of clutch means. It is noted that the small slots 62 for clutch means may be removed by the use of the idler shaft provided with a tapered base portion. The tapered idler shaft may be used for eliminating a friction pad 75 of clutch means.

Figure 2:
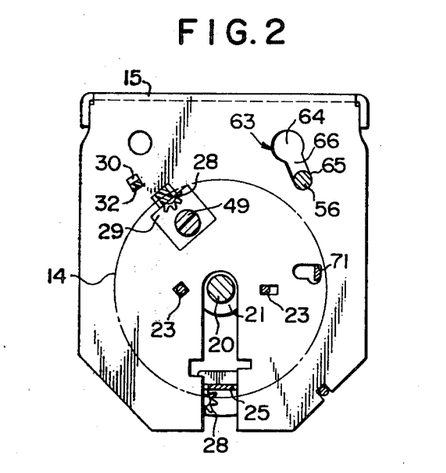
FIG. 2 is a front sectional elevational view of the television tuner of FIG. 1, taken along lines 2—2 of FIG. 1.

The main feature of the present invention is that the stud member or pivot shaft fixed on the chassis base can be removed from the pivotally mounted member. In other words, the pivotal shaft 54 of the pivotally mounted member 50 is pivotally mounted by means of notch 63 in the front wall 14, as shown in FIG. 2, which includes a large opening portion 64, a small opening portion 65 and a continuous opening portion 66 therebetween. For easy and simple assembly of the pivotally mounted member 50, the sizes of each portion of the pivotal shaft 54 may be designed with particular relations with the notch 63 of the front wall 14 so as to mount the member 50 on the chassis base 13 easily and accurately. For instance, if each portions 55, 56 and 57 of the pivotal shaft 54 have diameters A, B and C respectively, and portions 64, 65 and 66 of the notch 63 in the front wall 14 have diameters or width D, E and F respectively, the following relation is established.

$$B \approx E \leq F < A \leq D < C$$

In addition, the gap width S of the reentrant neck portion 56 may be designed equal or slightly larger than the thickness t of the front wall 14. With the relation of B<A<C, the pivotally mounted member 50 is assembled in the notch 63 of the front wall 14 by the steps of inserting the head and neck portions 55 and 56 of the pivotal shaft 54 into the large opening portion 64 of the notch 63, and sliding the neck portion 56 passing through the continuous opening portion 66 to the small opening portion 65 which has an equal or slightly larger diameter than the cross-sectional diameter of the circular neck portion 56 so as to rotatably set the pivotal shaft 54.

Figures 3, 4, 5:
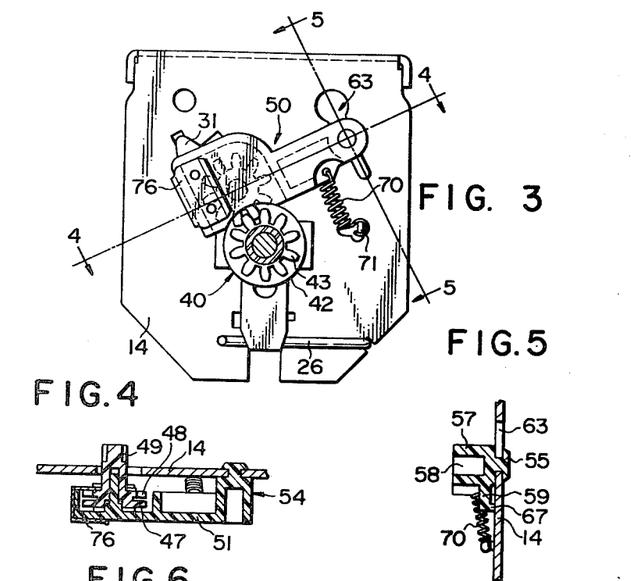
FIG. 3 is a front sectional elevational view of a different portion of the television tuner of FIG. 1, taken along lines 3—3 on FIG. 1.
FIG. 4 is a sectional view of a portion of the fine tuning arrangement, taken along lines 4—4 of FIG. 3.
FIG. 5 is a sectional view of a different portion of the fine tuning arrangement, taken along lines 5—5 of FIG. 3.

The important feature of the pivotally mounted member 50 of the present invention will be described in more detail together with its manner of assembly. As shown in FIG. 3, since the tension coil spring 70 biases the pivotally mounted member 50 in the downward direction, the pivotal shaft 54 does not fall out from the notch 63 of the front wall 14, unless a counter-force is applied thereto. In this connection, the notch 63 of which the large opening portion 64, continuous opening portion 66 and small opening portion 65, as shown in FIG. 2, are aligned in a straight line with the bias direction. This may be modified, however, to align these portions in a circular line so that the pivotal shaft is initially inserted into the large opening portion located at near the right angles to the bias direction. Such modification of the notch shape makes a more stable structure for preventing falling out of the pivotally mounted member 50 due to an accidental force in a single direction. In this structure, the accurate design of the reentrant gap S of the neck portion 56 to the thickness t of the front wall 14 is an important matter for obtaining the desired pivotal movement.

In order to improve the parallel holding of the lever plate 51, the pivotal shaft 54 is mounted on the front wall 14 at a right angle by using the projecting portion 59, as shown in FIG. 5. This projecting portion 59, which may be formed as an extended portion of the lever plate 51 instead of the pivotal shaft 54 in the direction of the bias force of the spring coil 70, contacts the front wall 14 with its end portion and it is desired to form a small contact portion 67 at the end portion. Since the contact portion 67 of the projecting portion 59 abuts at a location distant from the pivotal shaft 54, the desired arrangement will be easily achieved without inclining the pivotal shaft 54. In other words, though indispensable clearance between the notch 63 and the pivotally mounted member 50 may produce an inclined assembly due to the bias force of the coil spring 70, an addition of the contact portion 67 of the projected portion 59 prevents such inclined assembly of the lever plate 51. In this connection, the use of the large head and body portions of the pivotal shaft 54 may be also useful for prevention of inclined assembly, but the large scaling of such portions needs much broader space for mounting assembly and sufficient materials for moldforming such parts. Therefore, the short and slender projected portion 59 as shown in FIGS. 6 and 7, is one of the most desired shapes to save plastic molding materials; it also works efficiently as a mounting in a limited space.

In the pivotally mounted member 50 suitable for a rotary presetting type or fine tuning arrangement, in which the second driving gear 45 is mounted on the idler shaft 53 with frictional clutch means, there are other features. One of these is the addition of a flange portion 68 at the radially end portion of the lever plate 51 at the right angle in the rear direction so that the spring clip 76 for clutch means may be easily secured in the assembly step. It is noted that if the flange portion 68 is not formed, some assembly jigs are necessary for fixing the spring clip 76 to make frictional relation between the lever plate 51 and the second driving gear 45 through the friction pad 75, because the fixing width of the spring clip 76 is smaller than the thickness of the frictionally fixed parts. However, the flange portion 68 serves to guide the fixing width of the spring clip 76, and thus the use of the jig can be avoided in the assembly step. Also, the flange portion 68 is molded integrally with the lever plate 51 with a slightly lower height than that of the framing 52, as shown in FIG. 7, for functional and economical advantages. Another feature of the pivotally mounted member 50 is to form the suitable number of small slots 62 on the rear face of the lever plate 51, as shown in FIG. 6 to produce stable torque by heavy frictional contact factor between the lever plate 51 and the friction pad 75. These slots 62 are located at the contact portion of the frictional pad 75 so that the friction between the lever plate 51 and the second driving gear 45 may be adjusted only by the friction torque between the friction pad 75 and the second driving gear 45. As described hereinbefore, the suitable friction torque is also obtained in engagement of the taper surfaces between a tapered idler shaft of the lever plate 51 and the tapered receiving hole of the second driving gear 45. In this case, friction force may be adjusted by the taper angle in engagement, and the friction pad can be removed, whereby the production costs are materially lowered.

Since the tension coil spring 70 is suspended between the hole 60 of the pivotally mounted member 50 and a struck-out portion 71 of the front wall 14, the pivotally mounted member 50 is normally biased thereby into a position urging the second driving gear 45 to fully mesh with the first driving gear 40 on the fine tuning shaft 35 and to disengage with the pinion gear 28 of the adjustable element 27. This position performs the first position of the pivotally mounted member 50 for disengagement of the fine tuning arrangement 16. A second position of the pivotally mounted member 50 for engagement of the fine tuning arrangement 16 is established when a counter force to the bias force is given from the fine tuning shaft 35. In order to limit the movement of the second driving gear 45 mounted on the idler shaft 53 of the pivotally mounted member 50 in the radial direction to a given distance from the fine tuning shaft 35, a guide plate 72, as shown in FIG. 8, has a length hole 73 through which the hub portion 46 of the second driving gear 45 passes and a circular hole 74 through which the channel selector shaft 20 passes. Therefore, the movement of the hub portion 46 is limited to be within the length hole 73. Also, the guide plate 72 is positioned on the boss 34 of the stop member 31.

The gear teeth of the mating spur gears 43, 44, 47 and 48 of the first and second driving gears 40 and 45 are relatively long, and these spur gears have a relatively low diametral pitch. While the gear teeth of the pinion 49 and the pinion gears 28 are relatively short in length, the pinion and pinion gears are of relatively high diametral pitch. In this manner, the difference in tooth length will permit engagement and disengagement between the pinion 49 and pinion gear 28 without disengagement between the first and second driving gears 40 and 45. In order to move the pivotally mounted member 50 as a coupling means for fine tuning transmission, a friction clutch means is assembled to the second driving gear 45 on the idler shaft 53. For instance, the friction pad 75 is interposed between the end of the second driving gear 45 and the rear face of the lever plate 51, and a removable U-shaped spring clip 76 is positioned over the front face of the lever plate 51 and clumps the second driving gear 45 with a substantial force. One end of the spring clip 76 is positioned by the pair of holes 77 which engages bosses 61 in the lever plate 51 and the other end of the spring clip 76 is bifurcated to provide arms which engage the rear surface of the spur gear 48 of the second driving gear 45. The force exerted by the clip 76 on the second driving gear 45 must be overcome before this second driving gear can be rotated. Accordingly, when a rotational force is exerted on the fine tuning shaft 35, this force is translated into movement of the second driving gear 45 away from the first driving gear 40 since the frictional load on the second driving gear 45 initially prevents this gear from rotation, and engaged teeth of the first and second driving gear 40 and 45 act as cam surfaces to move these gears apart. When these gears are moved apart, the lever plate 51 pivots and the pinion 49 of the second driving gear 45 is moved into engagement with the pinion gear 28. When the rotational force on the fine tuning shaft 35 is increased sufficiently to cause slippage between the friction pad 75, the second driving gear 45 and the lever plate 51, the second driving gear 45 may be rotated while the spur gears 43, 44, 47 and 48 are in the position so that the pinion gear 28 is rotated and the adjustable element 27 is adjusted axially.

As soon as the rotational force is removed from the fine tuning shaft 35, spur gears 43, 44, 47, and 48 are no longer urged apart and the lever plate 51 returns to its initial position due to the bias of the tension coil spring 70. If oppositely directed rotational force is exerted on the fine tuning shaft 35, the first and second driving gears 40 and 45 will again be forced apart and the pinion gear 28 may be rotated in the opposite direction. Briefly, the rotary pre-setting fine tuning arrangement of the above arrangement includes clutch means to change the position of the pivotally mounted member 50, from the first initial position to the second fine tuning position engaging the second driving gear 45 with the adjustable element 27. The pinion gears 28 of the elements 27 move through a predetermined path as the turret 12 of the VHF television tuner 11 is rotated and when a particular station is selected one of the pinion gears 28 is positioned adjacent the pinion 49. When it is desired to adjust the fine tuning of the station, initial rotation of the fine tuning shaft 35 in either direction is effective to apply an operative load on the mating gears of the first and second driving gears 40 and 45 and to change the lever plate 51 to its second position, and further rotation of the fine tuning shaft 35 in the same direction is effective to adjust the adjustable element 27 mounted on the coil unit 18.

Figure 9:
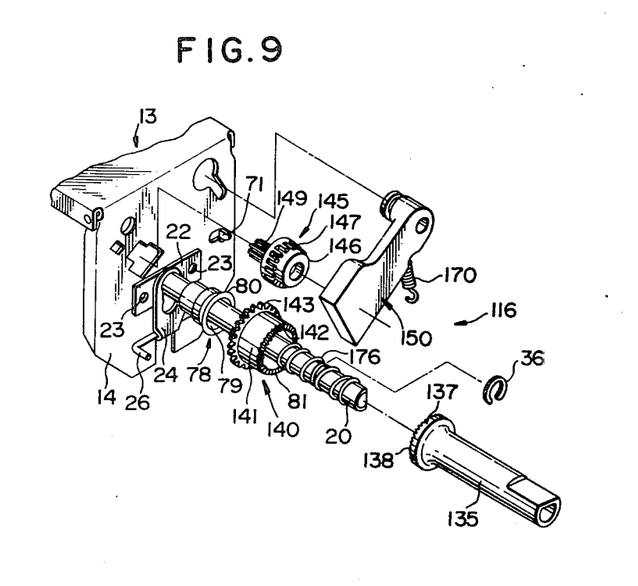
FIG. 9 is an exploded view similar to FIG. 8, but illustrating the push pre-setting fine tuning arrangement of another embodiment of the present invention.

The above embodiment is directed to the rotary pre-setting type, but the pivotally mounted member of the present invention is applied to the push pre-setting type of fine tuning arrangements, as shown in FIG. 9 of the exploded view on the front wall side.

FIG. 9 is an exploded view, similar to that of FIG. 8, showing the push pre-setting type fine tuning arrangement for the VHF television tuner which comprises a substantially U-shaped chassis base 13 as shown in the previous embodiment. The chassis base includes the front wall 14, top wall and the rear wall, and the top wall is provided with bent flange portions on both sides for reinforcing the chassis base structure. A chassis cover (not shown) is attached over the open sides of the chassis base. The channel selector shaft 20 may be supported on the front wall 14 by means of bearing strap 22 which is provided with location projections arranged to be received in corresponding opening in the front wall 14. The bearing strap 22 is provided with a suitably shaped opening for the channel selector shaft 20, which provides opposed V-shaped bearing surfaces against which the selector shaft 20 is held by means of the right angle end portion of the torsion wire spring 26, the end portion engaging the bottom flange 25 of the slotted retaining washer 24. The upper end of washer 24 rides in a groove formed in the channel selector shaft 20. In addition to biasing the forward end of the channel selector shaft 20 into engagement with the bearing strap 22, the rear end of the torsion wire spring 26 may be arranged to exert a cooperating biasing force on the rear end of the selector shaft 20 and also provide a detent action for this shaft.

On the other hand, a fine tuning shaft 135 of the push pre-setting fine tuning arrangement 116 is mounted concentrically on the selector shaft 20 by means of the C-shaped washer to prevent forward movement along the channel selector shaft 20, in a manner similar to that of the previous embodiment. The rear end portion of the fine tuning shaft 135 is, however, provided with an integral tubular flange portion 137 of which the rear surface is provided with an annular series of fine teeth 138 which project rearwardly therefrom as one of clutch surface of the clutch means. A bearing sleeve 78 is also positioned on the channel selector shaft 26, and the forward end of the bearing sleeve 78 is provided with a central bore 79 which is adapted to receive one end of a coil spring 176, the other end of which bears against the rear end of the tubular flange portion 137. Accordingly, when no rearward force is exerted on the fine tuning shaft 135, this shaft and the bearing sleeve 78 are biased with respect to each other to distant positions by means of the coil spring 176.

The forward end of the bearing sleeve 78 is flared outwardly so as to provide a sharp corner 80 which acts as a supporting fulcrum for a tiltable first driving gear 140. The first driving gear 140 comprises a tubular sleeve 141 which loosely encircles the bearing sleeve 78 and is provided with a forward end flange shoulder 142 adapted to receive the corner 80 of the bearing sleeve. By positioning the shoulder 142 at one end of the first driving gear 140, this assembly is permitted to tilt about the corner 80 as a fulcrum when force is exerted thereon.

The rear end of the sleeve 141 is provided with an annular series of gear teeth 143 which project radially outwardly from the periphery of the sleeve 141. The forward end of the sleeve 141 is formed with an annular series of fine teeth 81 which project forwardly from the first driving gear 140 and are adapted to mesh with the fine teeth 138 on the rear surface of the fine tuning shaft 135 to form clutch means.

Meanwhile, the gear teeth 143 on the first driving gear 140 are continuously in mesh with gear teeth 147 which are formed in a hub portion 146 of a second driving gear 145. The rear portion of the hub portion 146 is formed with a pinion 149 which is adapted to be moved into engagement with the pinion gear 28 of the adjustable element 27, as described in the previous embodiment, for adjustment of inductance of the oscillator coil on the coil unit 18. The second driving gear 145 is rotatably supported on the front wall 14 of the chassis base 13 by means of the idler shaft integrally formed with the lever plate of the pivotally mounted member 150, without using any friction clutch means. The pivotally mounted member 150 is biased by means of the tension coil spring 170 suspended between the member 150 and the struck-out portion 71 of the front wall 14, so that the free end of the member 150 is continuously urged toward the channel selector shaft 20 and the fine tuning shaft 135. Accordingly, the biasing force of the coil spring 170 normally functions to tilt the first driving gear 140 since the gear teeth 147 engage the tips of the gear teeth 143 on the first driving gear 140 and exert a downward force on the rear end of the first driving gear 140. In this position, the pinion 149 of the second driving gear 145 is positioned outside the path of movement of the pinion gear 28 of the adjustable element 27, and the coil spring 176 of clutch means serves to keep disengagement between both annular series of fine teeth 81 and 138.

Accordingly, when the fine tuning arrangement 116 is not pushed, the channel selector shaft 20 may be rotated as desired so as to select a particular television channel and brings a particular one of the coil units into the operative position, and during this channel selecting operation the second driving gear 145 does not interfere with such channel selection. When it is desired to effect a fine tuning operation with respect to a selected channel, the fine tuning shaft 135 is moved rearwardly along the channel selector shaft 20 by the exertion of pressure on the fine tuning knob. In this movement, the fine teeth 138 on the fine tuning shaft 135 engage and mate with the fine teeth 81 on the first driving gear 140. Since the first driving gear 140 is normally tilted, the fine teeth 81 will first engage the fine teeth 138 at a point below the channel selector shaft 20 with the result that a force is exerted on the forward bottom edge of the first driving gear 140 so that this gear 140 is moved about the fulcrum of the corner 80 on the bearing sleeve 78. As a result, the first driving gear 140 is substantially coaxial with the selector shaft 20 and the fine teeth 138 and 81 are fully in mesh, and the second driving gear 145 has been moved outwardly to such a position that the pinion 149 thereon is moved into engagement with the pinion gear of the adjustable element.

If, now, the fine tuning shaft 135 is rotated while rearward pressure is maintained on this shaft, clutch means rotates the first driving gear 140 due to the full engagement of the fine teeth 138 and 81, the rotation of the first driving gear 140 produces rotation of the second driving gear 145 due to the engagement of the gear teeth 143 and 147, and rotation of the second driving gear 145 produces a fine tuning adjustment of the element due to the engagement of the pinion 149 and pinion gear. Briefly, the clutch means of the above push pre-setting fine tuning arrangement which is operated by pushing operation of the fine tuning shaft, serves to couple the first and second driving gears and to change the position of the pivotally mounted member from the first position to the second position for transmitting rotation of the fine tuning shaft to the selected adjustable element.

What is claimed is:

1. A television tuner of the turret type comprising a chassis base, a rotatable turret mounted within said chassis base, a plurality of tuning coil units corresponding to different television channels each having an adjustable element, a memory fine tuning arrangement for selectively adjusting said adjustable elements in response to the position of said rotatable turret, a fine tuning shaft; pivot means mounted on said chassis base, spring means normally biasing said pivot means in the direction toward said fine tuning shaft; a first driving gear on said fine tuning shaft; a second driving gear on said pivot means; clutch-coupling means responsive to a force exerted on said fine tuning shaft for permitting movement of said pivot means from a first position to a second position for engagement of the respective one of said adjustable elements and said second driving gear to adjust said adjustable element of a selected one of said tuning coil units, said pivot means being out of engagement in said first position so as to permit rotation of said turret, wherein said pivot means further comprise a pivotally mounted member of substantially integral construction including a lever plate, a pivotal shaft at one end of said lever plate, and an idler shaft at the other end of said lever plate, said pivotal shaft having a body portion, a head portion and a neck portion, said chassis base comprising elongated notch means located directly in said chassis base, said neck portion of said pivotal shaft being pivotally secured in said notch means to provide a journal bearing for said pivotal shaft.

2. The fine tuning arrangement as claimed in claim 1, wherein said pivotally mounted member is a die-molded synthetic resin member having a substantially uniform thickness and comprises framing means for reinforcement.

3. The fine tuning arrangement as claimed in claim 1, wherein the maximum cross-sectional sizes of the head portion (A), neck portion (B), and body portion (C), said pivotal shaft for said pivotally mounted member have a relation of $B<A<C$, whereby said pivotal shaft may be pivotally secured to said notch formed in said chassis base by insertion of the head and neck portions into the large opening portion of said notch and slidingly setting the neck portion in the small opening portion from the large opening portion through the continuous opening portion of said notch in said chassis base.

4. The fine tuning arrangement as claimed in claim 3, wherein said large, continuous and small opening portions of said notch in said chassis base are aligned in a straight line with the biasing direction for said pivotally mounted member whereby said pivotal shaft is readily set in position with the cooperation of said spring means.

5. The fine tuning arrangement as claimed in claim 3, wherein said large and small opening portions of said notch are located at substantially a right angle to the biasing direction for preventing falling out of said pivotally mounted member.

6. The fine tuning arrangement as claimed in claim 3, wherein said pivotally mounted member is provided with a portion projecting in the direction of said biasing spring means, said projecting portion contacting the surface of said chassis base at its end portion for simplifying assembly of said pivotally mounted member.

7. The fine tuning arrangement as claimed in claim 6, wherein said projecting portion is provided with a contact portion abutting said chassis base and is formed integrally on the side of said pivotal shaft.

8. The fine tuning arrangement as claimed in claim 1, wherein said clutch-coupling means includes a first annular series of teeth formed on said fine tuning shaft and a second annular series of teeth formed on said first driving gear, whereby said clutch coupling means is operable by a pushing force exerted on said fine tuning shaft for obtaining the second position of said pivotally mounted member.

9. The fine tuning arrangement as claimed in claim 1, wherein said clutch-coupling means includes a spring clip to produce frictional force between said pivotally mounted member and said second driving gear, whereby said clutch coupling means is operable by a rotational force exerted on said fine tuning shaft for obtaining the second position of said pivotally mounted member.

10. The fine tuning arrangement as claimed in claim 9 wherein said clutch-coupling means further includes a clutch pad, said clutch pad is seated on the indented rear face of said lever plate so as to prevent slipping of said clutch pad on the lever plate for obtaining the stable frictional force.

11. The fine tuning arrangement as claimed in claim 9, wherein the frictional force between said pivotally mounted member and said second driving gear is produced by taper surface engagement whereby the friction force can be adjusted by the taper angle in said engagement.

12. In a television tuner of the turret type wherein a rotatable turret is mounted within a chassis base, and which includes a plurality of tuning coil units corresponding to different television channels each having an adjustable element, wherein a memory fine tuning arrangement for selectively adjusting said adjustable elements is responsive to the position of said rotatable turret, the improvement comprising fine tuning shaft means; pivot means including a die-molded synthetic resin member and framing means for reinforcement of said resin member, said pivot means being mounted pivotally on said chassis base, spring means normally biasing said resin member in the direction toward said fine tuning shaft; a first driving gear on said fine tuning shaft; a second driving gear on said pivotally mounted resin member; clutch-coupling means responsive to a force exerted on said fine tuning shaft for permitting movement of said pivotally mounted resin member from a first position to a second position for engagement of one of said adjustable elements and said second driving gear to adjust said one adjustable element of a selected one of said tuning coil units, said first position of said pivotally mounted member being out of engagement so as to permit rotation of said turret, wherein said pivot means further comprise a lever plate, pivotal shaft means at one end of said lever plate, and an idler shaft at the other end of said lever plate, said pivotal shaft means comprising a head portion (A), a neck portion (B), and a body portion (C), said portions having maximum cross-sectional sizes satisfying the relationship B<A<C, said chassis base comprising notch means shaped with large and small openings so that said pivotal shaft means may be pivotally secured to said notch means formed in said chassis base by insertion of the head and neck portions into said large opening of said notch means and slidingly setting the neck portion of the pivotal shaft means in the small opening of said notch means to provide a journal bearing for said pivotal shaft means.

* * * * *